United States Patent
Nguyen et al.

(10) Patent No.: US 7,640,461 B2
(45) Date of Patent: Dec. 29, 2009

(54) ON-CHIP CIRCUIT FOR TRANSITION DELAY FAULT TEST PATTERN GENERATION WITH LAUNCH OFF SHIFT

(75) Inventors: Thai-Minh Nguyen, San Jose, CA (US);
William Shen, San Jose, CA (US);
David Vinke, Happy Valley, OR (US);
Christopher Coleman, Woking (GB)

(73) Assignee: LSI Logic Corporation, Milpitas, CA (US)

( * ) Notice: Subject to any disclaimer, the term of this patent is extended or adjusted under 35 U.S.C. 154(b) by 211 days.

(21) Appl. No.: 11/939,573

(22) Filed: Nov. 14, 2007

(65) Prior Publication Data
US 2009/0125769 A1    May 14, 2009

(51) Int. Cl.
*G06K 5/04*    (2006.01)
*G11B 5/00*    (2006.01)
*G06F 1/00*    (2006.01)

(52) U.S. Cl. .................. 714/700; 714/731; 713/500

(58) Field of Classification Search .............. None
See application file for complete search history.

(56) References Cited

U.S. PATENT DOCUMENTS

| | | | |
|---|---|---|---|
| 6,877,123 B2 * | 4/2005 | Johnston et al. | 714/731 |
| 7,202,656 B1 * | 4/2007 | Gearhardt et al. | 324/76.53 |
| 7,334,172 B2 * | 2/2008 | Howard et al. | 714/726 |
| 7,558,998 B2 * | 7/2009 | Watanabe | 714/731 |

* cited by examiner

*Primary Examiner*—Christine T Tu
(74) *Attorney, Agent, or Firm*—Ryan, Mason & Lewis, LLP

(57) ABSTRACT

A clock pulse controller includes a test clock pulse input for receiving test clock pulses. A scan enable input receives a scan enable signal having a first state and a second state. A trigger pulse input receives a trigger pulse. A clock pulse output generates a launch clock pulse and a capture clock pulse from the test clock pulses immediately after receiving a predetermined number of the test clock pulses immediately following the trigger pulse. A delayed scan enable output generates a delayed scan enable signal that transitions from the first state to the second state between a leading edge of the launch clock pulse and a leading edge of the capture clock pulse.

12 Claims, 10 Drawing Sheets

ON-CHIP CIRCUIT FOR TRANSITION DELAY FAULT TEST PATTERN GENERATION WITH LAUNCH OFF SHIFT

BACKGROUND OF THE INVENTION

1. Field of the Invention

The present invention is directed to the design and manufacture of integrated circuits. More specifically, but without limitation thereto, the present invention is directed to the design and testing of logic for detecting transition delay faults in an integrated circuit.

2. Description of Related Art

To facilitate testing of integrated circuits using automated test equipment (ATE), test logic is generally included in the integrated circuit itself. The test logic usually functions only during testing and has no utility during normal operation of the integrated circuit in the field.

In a scan test, the flip-flop elements in the integrated circuit design are connected in large scan chains. During the scan test, test patterns typically generated by an automatic test pattern generator (ATPG) are shifted through the scan chains to initialize the flip-flop elements to a predetermined state. The output data from the logic elements connected to the flip-flop elements is captured by other flip-flop elements that are also part of the scan chains. The captured data is then shifted out. The automated test equipment (ATE) controls the shifting and capture phases and transmits the test patterns to the integrated circuit. The same clock signal is used during the shift and capture phases, and a scan enable signal is used to control when shifting occurs and when data is captured. The ATE also receives the captured data when it is shifted out and compares the captured data to expected results. There are two types of transition delay fault (TDF)/inline resistance fault (IRF) pattern formats: double-capture and launch-off-shift. The double-capture format generates two capture clock pulses when the scan enable signal is driven LOW, while the launch-off-shift format generates only one capture clock pulse when the scan enable is driven LOW. The launch-off-shift method of testing is called launch-off-shift because the logic under test begins to transition to the state that is captured immediately after the final shift.

SUMMARY OF THE INVENTION

In one embodiment, a clock pulse controller includes a clock pulse input for receiving test clock pulses. A scan enable input receives a scan enable signal having a first state and a second state. A trigger pulse input receives a trigger pulse. A clock pulse output generates a launch clock pulse and a capture clock pulse from the test clock pulses immediately after receiving a predetermined number of the test clock pulses immediately following the trigger pulse. A delayed scan enable output generates a delayed scan enable signal that transitions from the first state to the second state between a leading edge of the launch clock pulse and a leading edge of the capture clock pulse.

In another embodiment, a method of generating clock pulses for an integrated circuit includes steps of receiving test clock pulses, receiving a scan enable signal having a first state and a second state, and receiving a trigger pulse. A launch clock pulse and a capture clock pulse are generated from the test clock pulses immediately after receiving a predetermined number of test clock pulses immediately following the trigger pulse. A delayed scan enable signal is generated that transitions from the first state to the second state in the interval between the leading edge of the launch clock pulse and the leading edge of the capture clock pulse.

BRIEF DESCRIPTION OF THE DRAWINGS

The present invention is illustrated by way of example and not limitation in the accompanying figures, in which like references indicate similar elements throughout the several views of the drawings, and in which.

Figure 1:
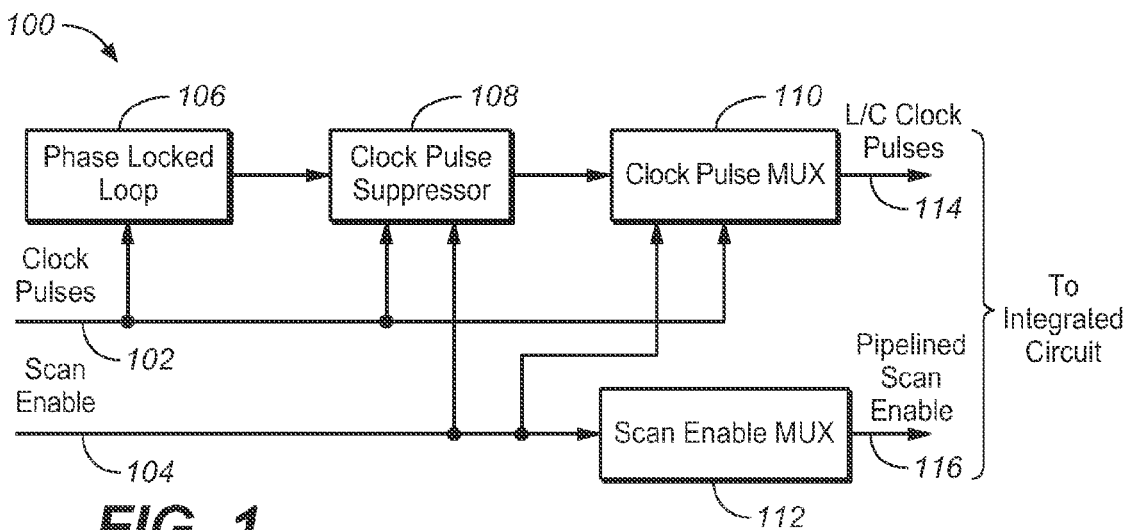
FIG. 1 illustrates a block diagram of a clock pulse controller for transition delay fault test pattern generation with launch off shift.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

Testing of integrated circuits such as latch based random access memory has previously been done using scan automatic test pattern generation (ATPG), for example, with Mentor Macrotest. For high-speed testing, the launch-off-shift method has been used in conjunction with a precise interval between the launch and capture clock pulses during pattern generation to increase the test speed. Typically, the ATE supplies the scan clock pulses directly. Consequently, the test speed is usually limited to between 200 and 300 MHz by the ATE clock edge placement accuracy and cycle limit.

To overcome the frequency limitations of the ATE, phase locked loops such as those routinely used in integrated circuit designs may advantageously be used to multiply the frequency of the scan clock to a desired test clock frequency. A clock suppression circuit separates two consecutive high speed test clock pulses from the phase locked loop output to generate launch and capture clock pulses. A clock multiplexer circuit switches between the two high speed test clock pulses and the slower ATE scan shift clock at appropriate points in the test pattern, and a scan enable pipeline/multiplexer circuit may be used with the scan enable signal to supply the last shift operation necessary for the launch-off-shift operation.

In one embodiment, a clock pulse controller includes a test clock pulse input for receiving test clock pulses. A scan enable input receives a scan enable signal having a first state and a second state. A trigger pulse input receives a trigger pulse. A clock pulse output generates a launch clock pulse and a capture clock pulse from the test clock pulses immediately after receiving a predetermined number of the test clock pulses immediately following the trigger pulse. A delayed scan enable output generates a delayed scan enable signal that transitions from the first state to the second state between a leading edge of the launch clock pulse and a leading edge of the capture clock pulse.

FIG. 1 illustrates a block diagram of a clock pulse controller 100 for transition delay fault test pattern generation with launch off shift. Shown in FIG. 1 are a scan clock pulse input 102, a scan enable input 104, a phase locked loop 106, a clock pulse suppressor 108, a clock pulse multiplexer 110, a scan enable multiplexer 112, launch/capture pulses 114, and a delayed scan enable output 116.

In FIG. 1, the clock pulse input 102 receives scan clock pulses, for example, from automated test equipment (ATE). The phase locked loop 106 generates test clock pulses at a desired test frequency, typically the design operating frequency of the integrated circuit under test. The integrated circuit under test (not shown) includes scan chains used for transition delay fault according to well-known integrated circuit testing techniques. The clock pulse suppressor 108 receives the test clock pulses from the phase locked loop 106 and generates the launch clock pulse and the capture clock pulse after the scan enable signal 104 transitions from the shift mode to the scan mode. The clock pulse controller 100 may be included on the integrated circuit chip, which typically already includes a phase locked loop.

Figure 2:
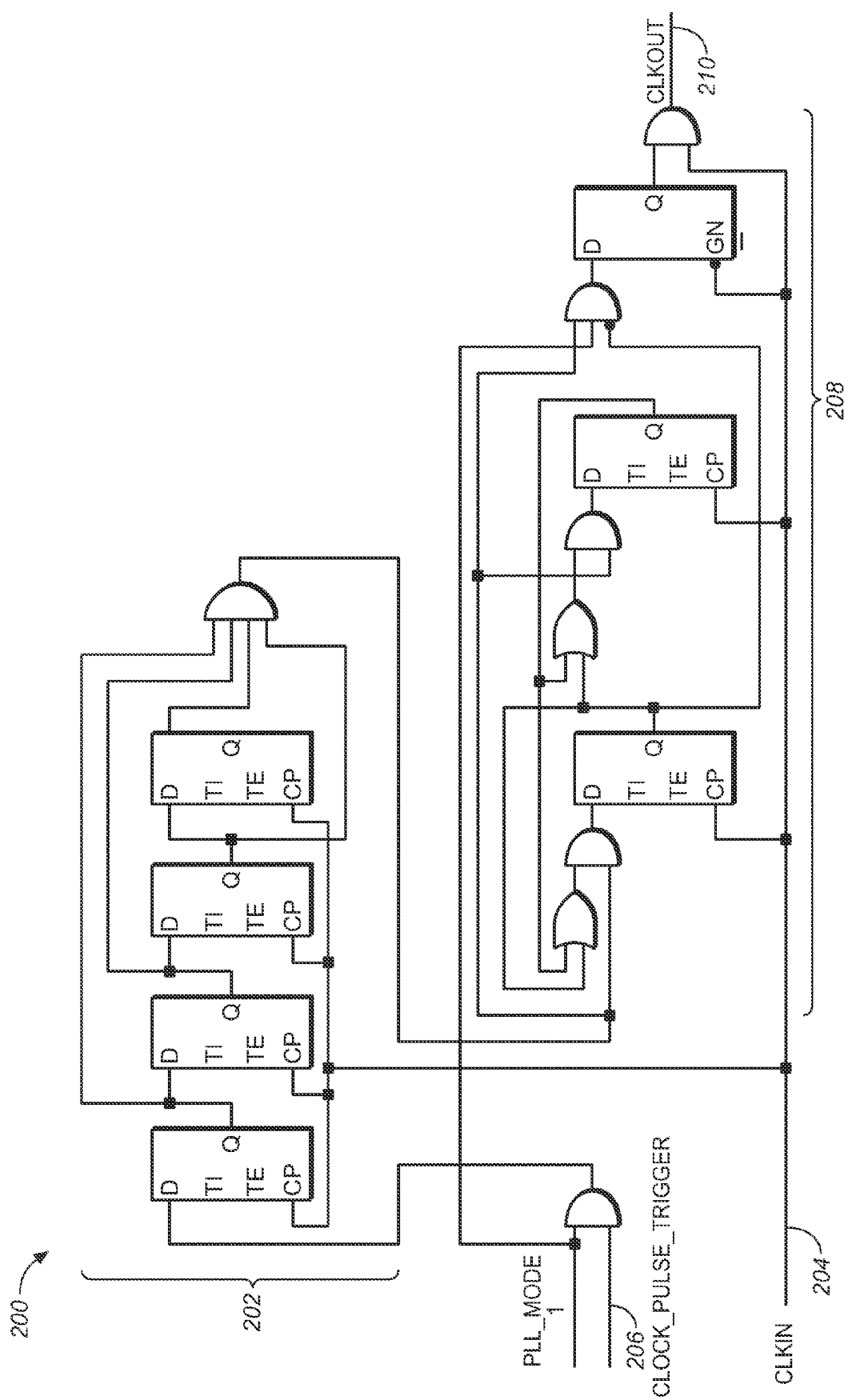
FIG. 2 illustrates a schematic diagram of a clock pulse suppression circuit for the clock pulse controller of FIG. 1.

FIG. 2 illustrates a schematic diagram 200 of a clock pulse suppressor for the clock pulse controller 100 of FIG. 1. Shown in FIG. 2 are a delay counter 202, a test clock pulse input 204, a clock pulse trigger input 206, a clock pulse separator 208, and a suppressed clock pulse output 210.

In FIG. 2, a trigger pulse received at the clock pulse trigger input 206, for example, from the automated test equipment (ATE), enables the delay counter 202 to count a selected number of test clock pulses from the phase locked loop 106 in FIG. 1 received by the test clock pulse input 204. In this example, five test clock pulses are counted to delay the transition of the logical output of the delay counter 202 from "0" to "1" at the clock pulse separator 208. In other embodiments, the number of test clock pulses may be selected to suit specific applications within the scope of the appended claims. The trigger pulse is held to a logical "1" long enough for the delay counter 202 to generate a logical "1" at the clock pulse separator 208 and is then driven to a logical "0" to clear the delay counter 202. Other means for generating a delayed logical "1" to the clock pulse separator 208 as a function of the number of test clock pulses from the test clock pulse input 204 may be used according to well-known integrated circuit design and manufacturing techniques.

The clock pulse separator 208 receives test clock pulses from the test clock pulse input 204 and generates the launch and capture clock pulses from two consecutive test clock pulses at the suppressed clock pulse output 210 in response to the logical "1" received from the delay counter 202. The launch and capture clock pulses at the suppressed clock output 210 have the same frequency and interval as the test clock pulses generated by the phase locked loop 106, advantageously overcoming the limitations of frequency and pulse intervals inherent in the automated test equipment (ATE). A pair of launch and capture clock pulses is generated at the clock pulse output 210 for each trigger pulse received at the clock pulse trigger input 206.

Figure 3:
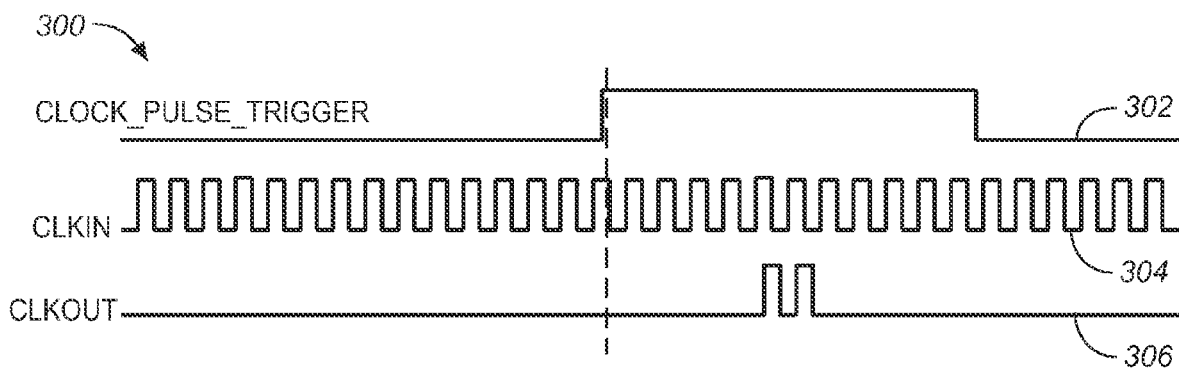
FIG. 3 illustrates a timing diagram for the clock pulse suppressor of FIG. 2.

FIG. 3 illustrates a timing diagram 300 for the clock pulse suppressor of FIG. 2. Shown in FIG. 3 are a clock pulse trigger 302, test clock pulses 304, and launch and capture clock pulses 306.

In FIG. 3, the launch and capture clock pulses 306 are generated following a delay of five consecutive test clock pulses after the transition of the clock pulse trigger 302 from a logical "0" to a logical "1".

Figure 4:
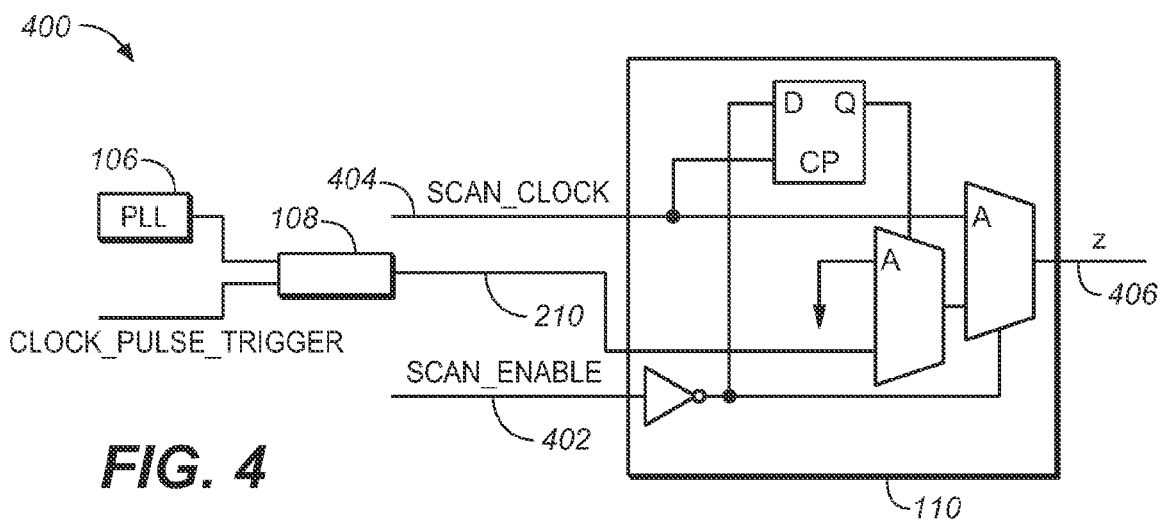
FIG. 4 illustrates a schematic diagram for the clock pulse controller of FIG. 1 with a clock pulse multiplexer.

FIG. 4 illustrates a schematic diagram 400 for the clock pulse controller of FIG. 1 with a clock pulse multiplexer. Shown in FIG. 4 are a phase locked loop 106, a clock suppressor 108, a suppressed clock pulse output 210, a clock pulse multiplexer 110, a scan enable input 402, a scan clock pulse input 404, and a clock multiplexer output 406.

In FIG. 4, the launch and capture clock pulses from the suppressed clock pulse output 210 are gated to the clock multiplexer output 406 when the scan enable input 402 is driven to a logical "0". When the scan enable input 402 is a logical "1", the scan clock pulses received at the scan clock pulse input 404 from the automated test equipment (ATE) are gated to the clock multiplexer output 406. The flip-flop in the clock pulse multiplexer 110 converts the scan clock pulses 404 to a non-clock signal that selects the multiplexer driven by the flop Q-output when the scan enable input 402 is driven to a logical "1". This feature satisfies the requirement by the ATPG tool that the scan clock is always run as a clock.

Figure 5:
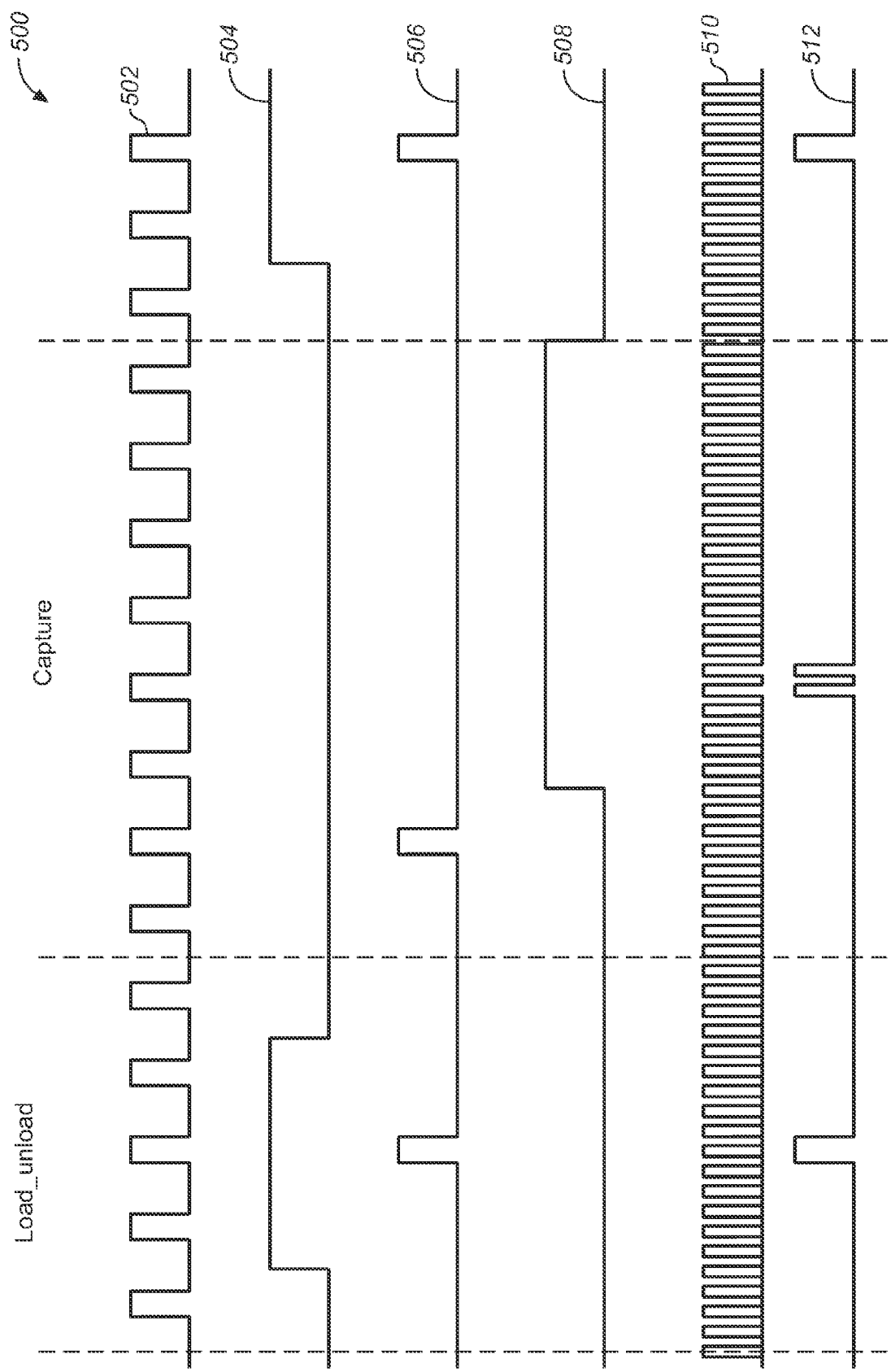
FIG. 5 illustrates a timing diagram for the clock pulse controller of FIG. 4.

FIG. 5 illustrates a timing diagram 500 for the clock pulse controller of FIG. 4. Shown in FIG. 5 are a phase locked loop reference clock 502, a scan enable signal 504, scan clock pulses 506, a clock pulse trigger 508, test clock pulses 510, and clock multiplexer output pulses 512.

In FIG. 5, the phase locked loop reference clock 502 is received as input to the phase locked loop 106, for example, from a local oscillator on-chip, to set the frequency of the test clock pulses 510 according to well-known integrated circuit design and manufacturing techniques. The clock multiplexer output pulses 512 are identical to the scan clock pulses 506 when the scan enable signal 504 is a logical "1" and are identical to the launch and capture pulses generated by the clock pulse output 210 when the scan enable signal 504 is a logical "0".

Figures 6, 6A:
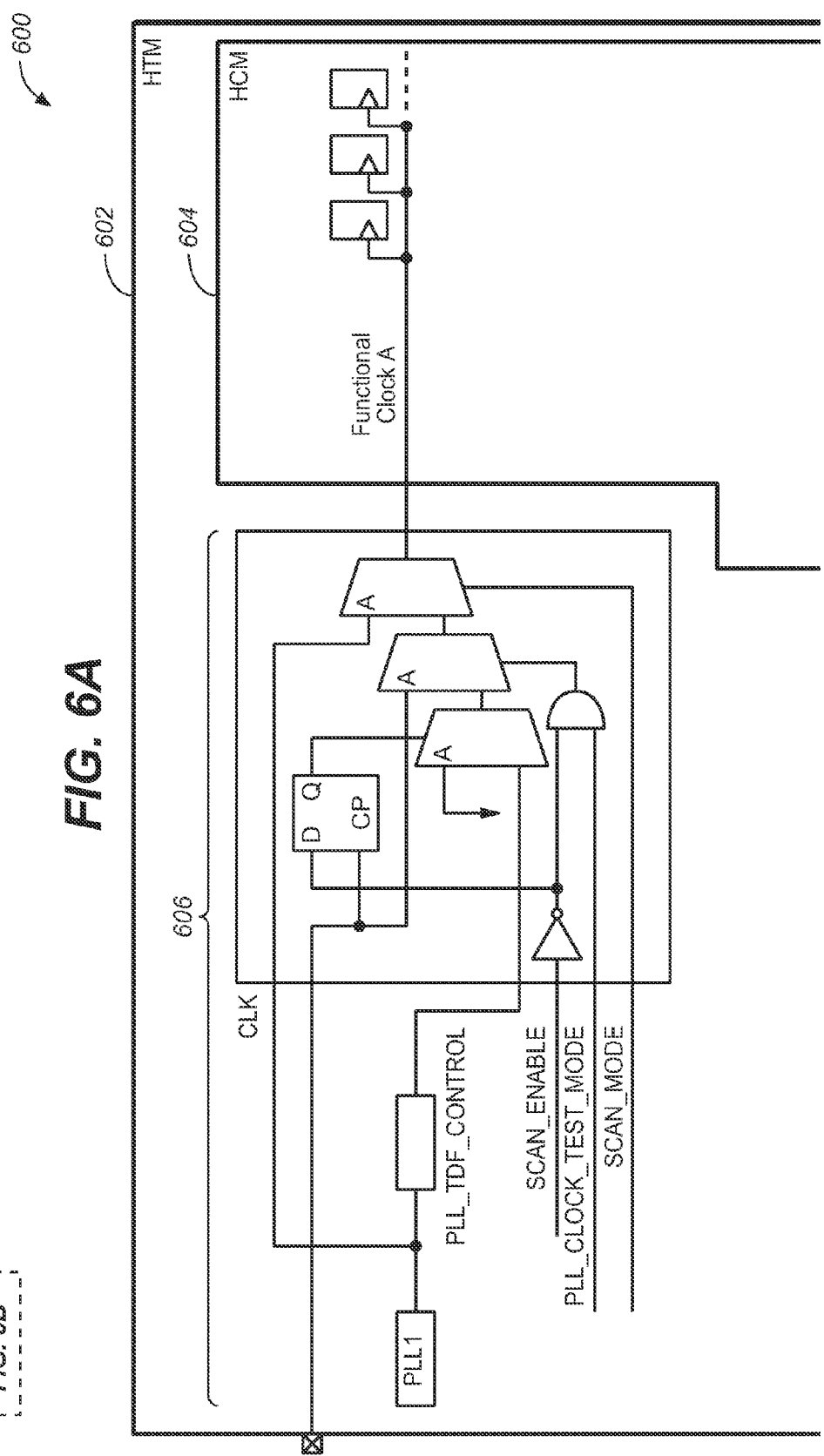
FIG. 6 illustrates a schematic diagram of an integrated circuit with the clock pulse controller of FIG. 4 for multiple scan clocks.
Figure 6B:
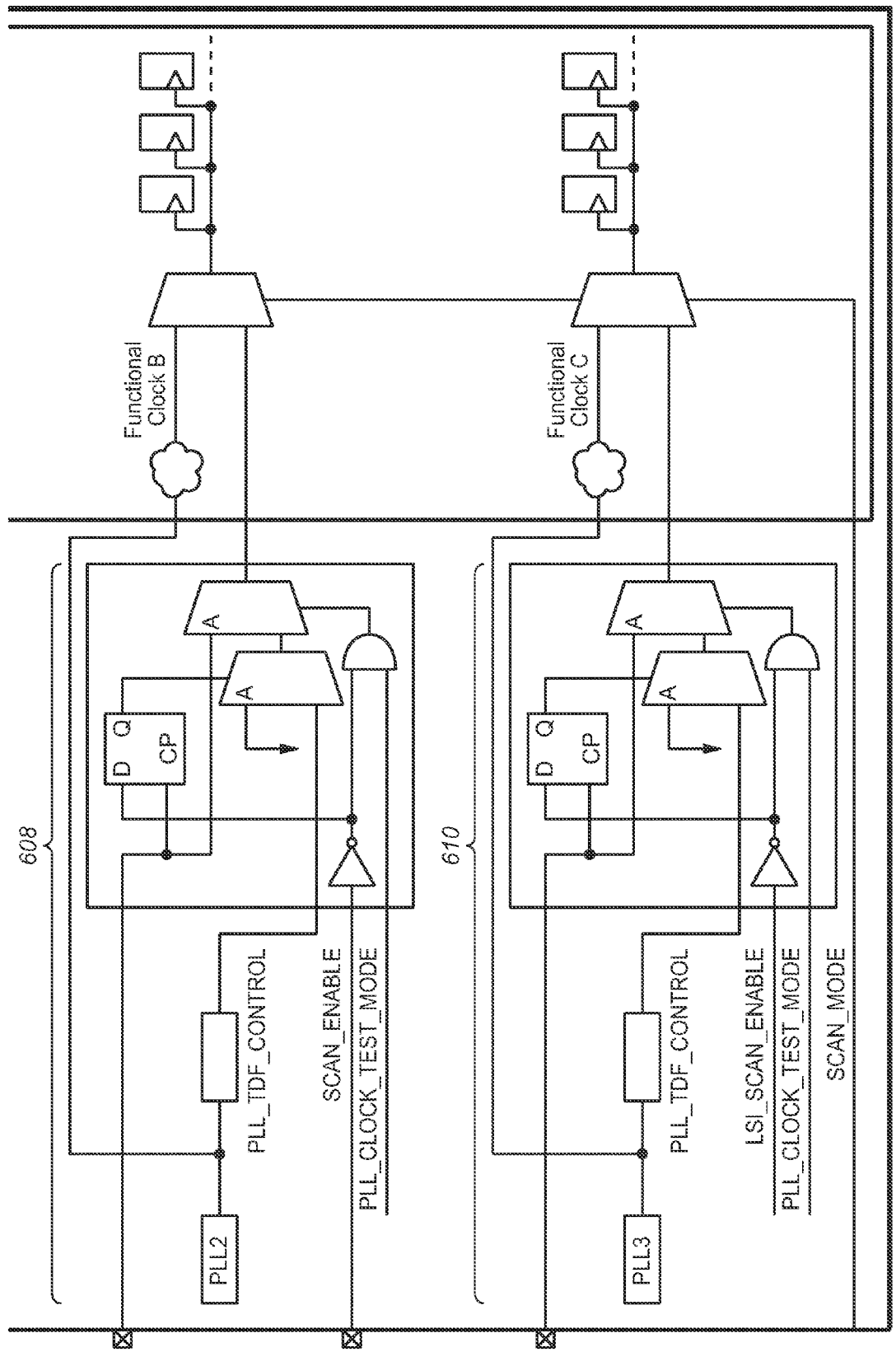

FIG. 6 illustrates a schematic diagram 600 of an integrated circuit with the clock pulse controller of FIG. 4 for multiple scan clocks. Shown in FIG. 6 are a top level module 602, a second level module 604, and clock pulse controllers 606, 608, and 610.

In FIG. 6, the top level module 602 includes the second level module 604 and the clock pulse controllers 606, 608, and 610 added for testing with phase locked loops. The second level module 604 includes the scan chains in integrated circuit design that interface to the clock pulse controllers 606, 608, and 610 in the top level module 602. The top level module 602 and the second level module 604 may be constructed according to well-known integrated circuit design and manufacturing techniques.

The clock pulse controller 606 includes an additional multiplexer for gating the functional clock, that is, the normal operating clock pulses, to the integrated circuit in the second level module 604 when not in the scan mode. The clock pulse controllers 608 and 610 do not include the additional multiplexer. In this embodiment, an additional multiplexer for each scan clock is included in the second level module 604 according to well-known integrated circuit techniques.

Figure 7:
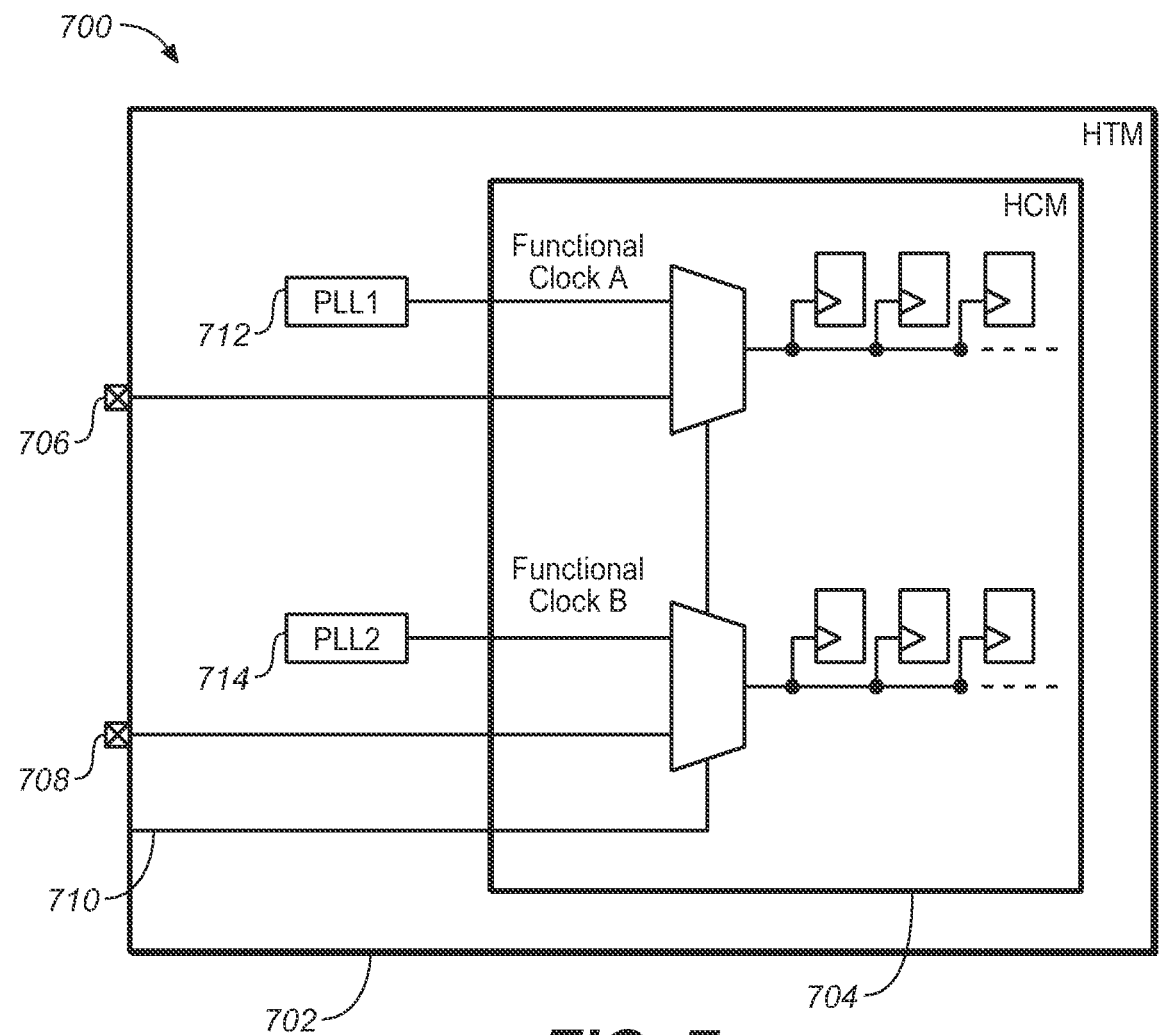
FIG. 7 illustrates a schematic diagram of an integrated circuit of the prior art with multiple scan clock inputs.

FIG. 7 illustrates a schematic diagram 700 of an integrated circuit of the prior art with multiple scan clock inputs. Shown in FIG. 7 are a top level module 702, a second level module 704, scan clock inputs 706 and 708, a scan mode input 710, and phase locked loops 712 and 714.

In FIG. 7, the multiplexers inside the second level module 704 switch the scan chain clock inputs inside the second level module 704 between the functional clocks and the scan clock inputs 706 and 708 in response to the scan mode input 710. The scan clock inputs 706 and 708 typically share the same pins with other signals used during normal operation of the integrated circuit in the second level module 704 but not during testing.

Figure 8:
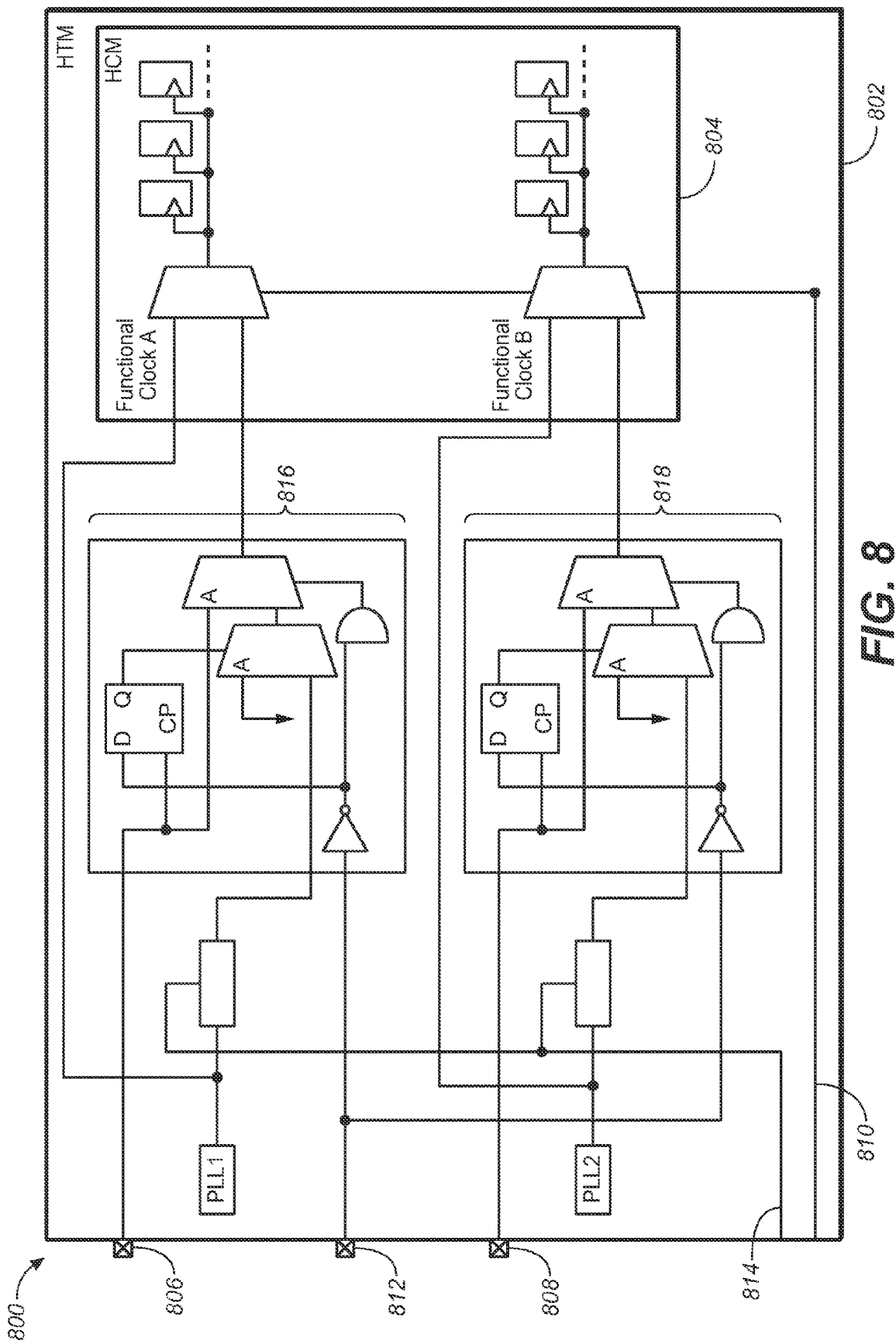
FIG. 8 illustrates a schematic diagram of an integrated circuit including clock pulse controllers for multiple scan clock inputs.

FIG. 8 illustrates a schematic diagram 800 of an integrated circuit including clock pulse controllers for multiple scan clock inputs. Shown in FIG. 8 are a top level module 802, a second level module 804, scan clock inputs 806 and 808, a scan mode input 810, a scan enable input 812, a clock pulse trigger input 814, and clock pulse controllers 816 and 818.

In FIG. 8, the multiplexers inside the second level module 804 switch the scan chain clock inputs between the functional clocks and the scan clock inputs 806 and 808 in response to the scan mode input 810. The clock pulse controllers 816 and 818 switch the scan chain clock inputs inside the second level module 804 between the scan clock inputs 806 and 808 and the launch/capture pulses generated by the clock pulse controllers 816 and 818 in response to the signals received at scan enable input 812 and the clock pulse trigger input 814 as described above with reference to FIG. 2.

Figure 9:
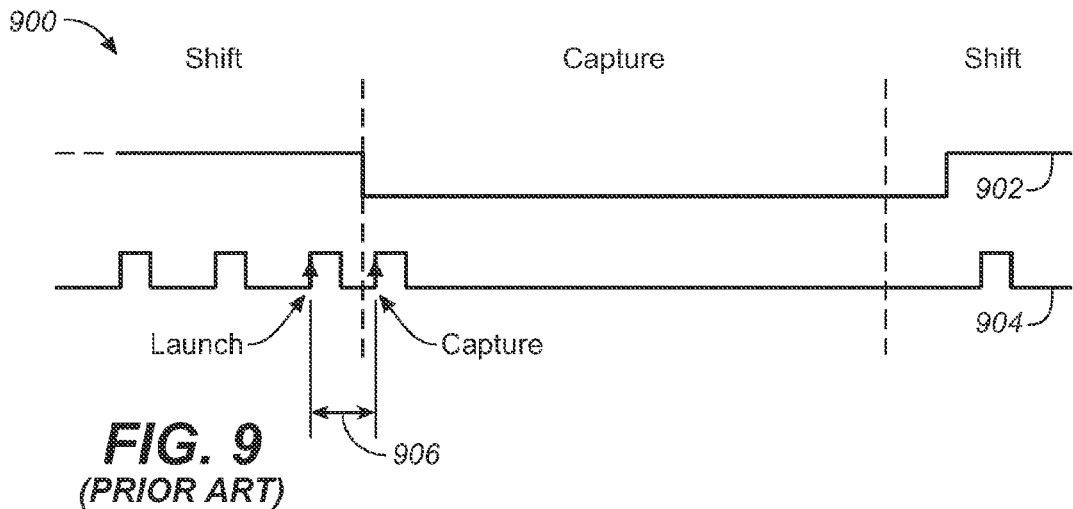
FIG. 9 illustrates a timing diagram of a launch-off-shift test pattern generated by a previous automated test pattern generation (ATPG) scheme according to the prior art.

FIG. 9 illustrates a timing diagram 900 of a launch-off-shift test pattern generated by a previous automated test pattern generation (ATPG) scheme according to the prior art. Shown in FIG. 9 are a scan enable signal 902, scan clock pulses 904, and a launch/capture interval 906.

In FIG. 9, the automated test equipment (ATE) must generate two consecutive high speed clock pulses for the launch and the capture operation. The two consecutive high speed clock pulses are separated by the launch/capture interval 906. Typically, the ATE is only capable of generating clock pulses at much lower frequencies than those required by the integrated circuit under test. Consequently, at-speed testing at the design operating frequency is impractical. However, using the high speed clock pulses generated by a phase locked loop, the clock pulse controller described above may be used to generate a launch-off-shift transition delay fault test pattern to overcome the limitations of the ATE with a pipeline multiplexer as follows.

Figure 10:
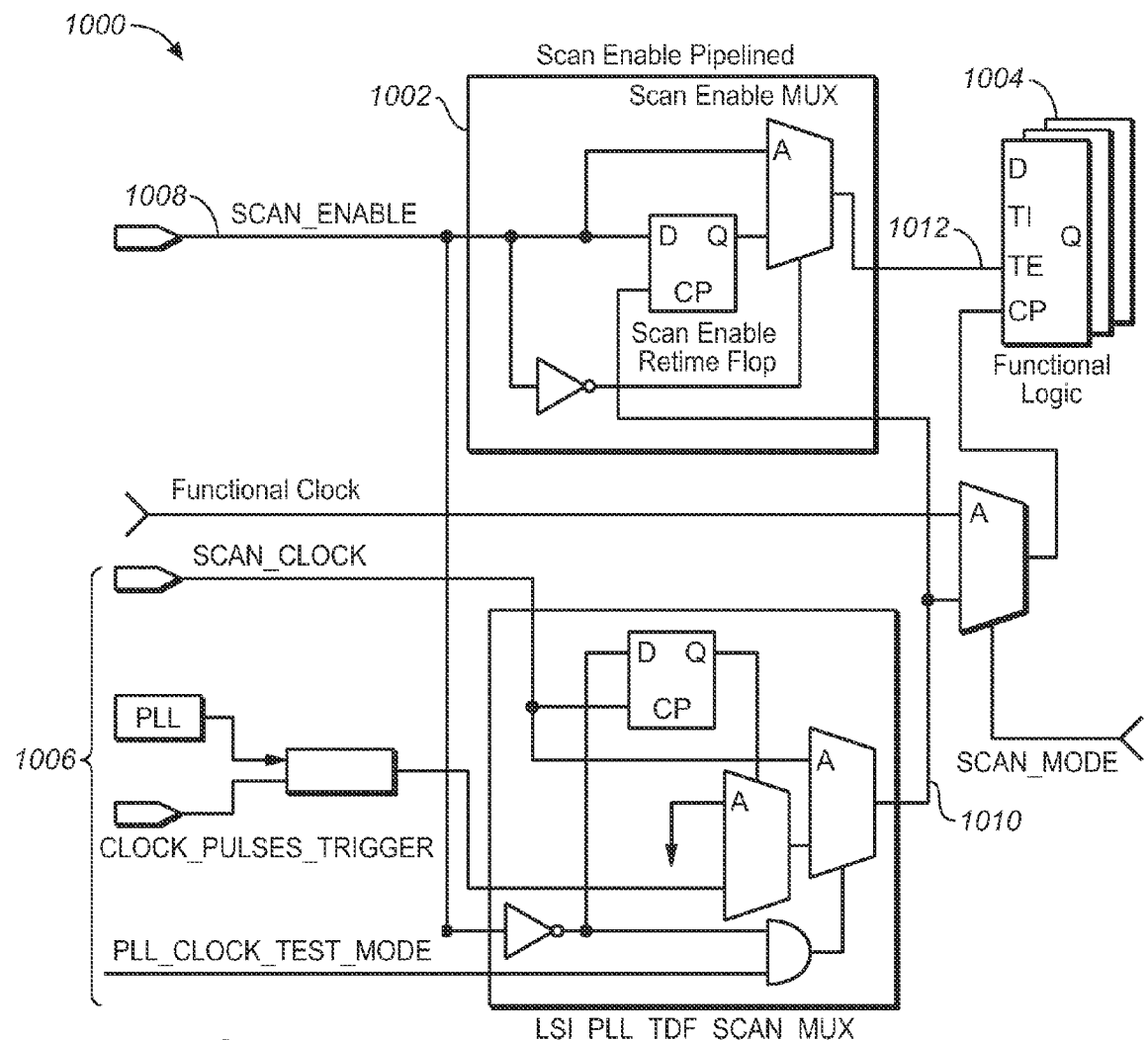
FIG. 10 illustrates a schematic diagram of a clock pulse controller with a scan enable pipeline multiplexer.

FIG. 10 illustrates a schematic diagram 1000 of a clock pulse controller with a scan enable pipeline multiplexer. Shown in FIG. 10 are a scan enable pipeline multiplexer 1002, functional logic 1004, a clock pulse controller 1006, a scan enable input 1008, a clock pulse output 1010, and a delayed scan enable 1012.

In FIG. 10, the scan enable pipeline multiplexer 1002 holds the delayed scan enable 1012 HIGH until after the rising edge of the launch clock pulse. The delayed scan enable 1012 is then driven LOW before the rising edge of the capture clock pulse to perform the capture operation. Other means may be implemented according to well-known integrated circuit design and manufacturing techniques to generate the delayed scan enable 1012 so that the transition from HIGH to LOW occurs in the interval between the leading edges of the launch and capture clock pulses.

Figure 11:
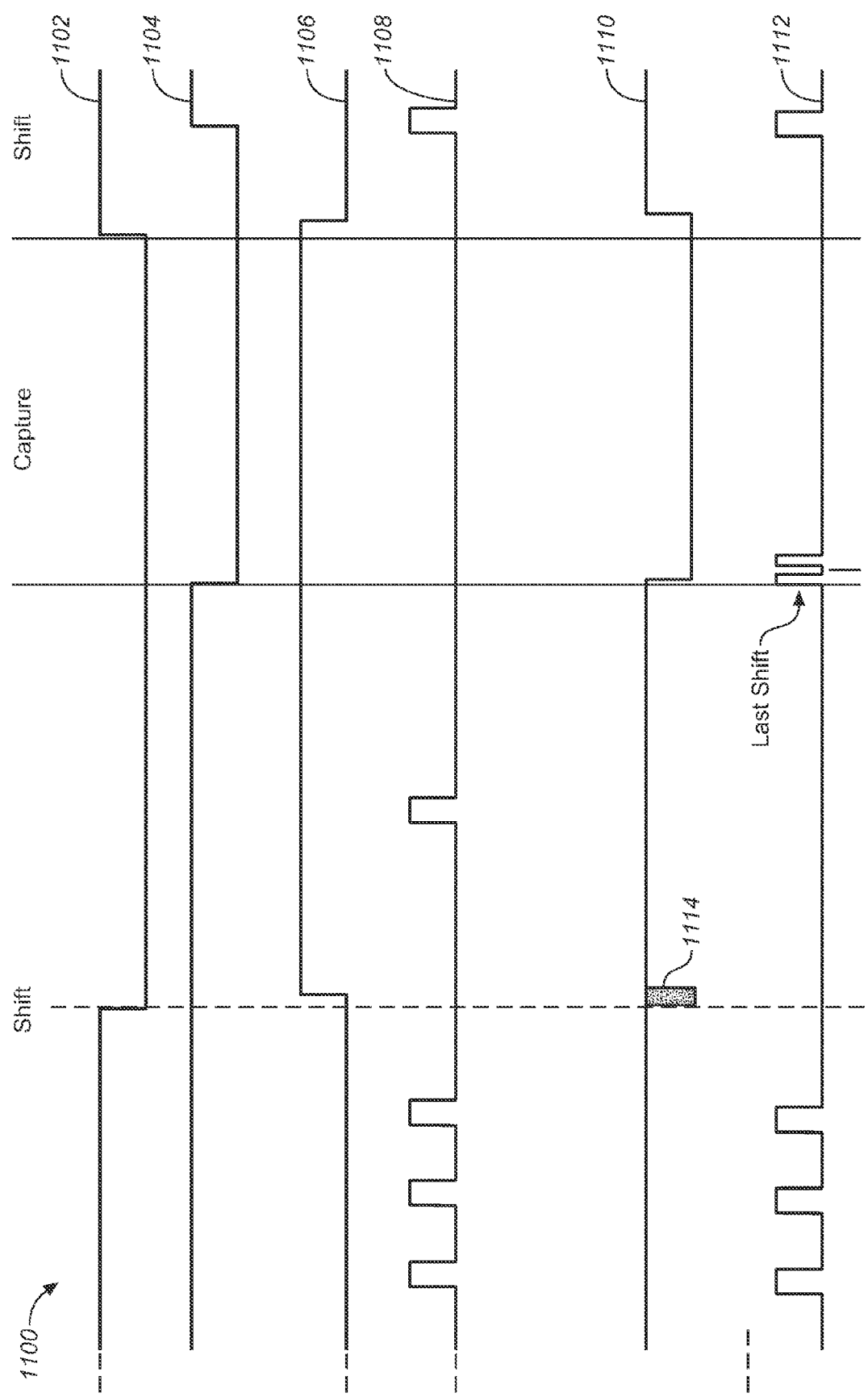
FIG. 11 illustrates a timing diagram for a launch-off-shift test pattern generated by for the clock pulse controller of FIG. 10.

FIG. 11 illustrates a timing diagram 1100 for a launch-off-shift test pattern generated by for the clock pulse controller of FIG. 10. Shown in FIG. 11 are a scan enable signal 1102, a scan enable pipeline "Q" output 1104, a scan enable multiplexer select signal 1106, scan clock pulses 1108, a delayed scan enable signal 1110, multiplexed test clock pulses 1112, and a transient 1114.

In FIG. 11, the scan enable signal 1102 is inverted in the scan enable pipeline multiplexer 1002 to generate the scan enable multiplexer select signal 1106. The flip-flop and the multiplexer in the scan enable pipeline multiplexer 1002 generate the delayed scan enable signal 1110 in response to the scan enable signal 1102 and the launch pulse from the clock pulse output 1010 of the clock pulse controller 1006. The falling edge of the delayed scan enable signal 1110 occurs between the rising edge of the launch clock pulse and the rising edge of the capture clock pulse to ensure proper launch-off-shift operation. In the illustrated embodiment, the rising clock edges are the leading edges that are used to initiate the launch and capture operations. In other embodiments, the leading edges used to initiate the launch and capture operations may be the falling edges of the launch and capture clock pulses.

The transient 1114 added to the scan enable pipeline flop Q-output 1104 in the delayed scan enable signal 1110 results from the transition of the scan enable multiplexer select signal 1106 in the scan enable pipeline multiplexer 1002. However, the clock pulse controller 1006 inhibits scan clock pulses in the multiplexed test clock pulses 1112, which avoids inducing errors in the transition delay fault test.

The rising edge of the last shift clock pulse 1112 in FIG. 11, the launch clock, occurs while the delayed scan enable 1110 is HIGH. The delayed scan enable 1110 then transitions to LOW between the launch and capture clock pulses to perform the capture operation.

In another embodiment, a method of generating clock pulses for an integrated circuit includes steps of receiving test clock pulses, receiving a scan enable signal having a first state and a second state, and receiving a trigger pulse. A launch clock pulse and a capture clock pulse are generated from the test clock pulses immediately after receiving a predetermined number of test clock pulses immediately following the trigger pulse. A delayed scan enable signal is generated that transitions from the first state to the second state in the interval between the leading edge of the launch clock pulse and the leading edge of the capture clock pulse.

Figure 12:
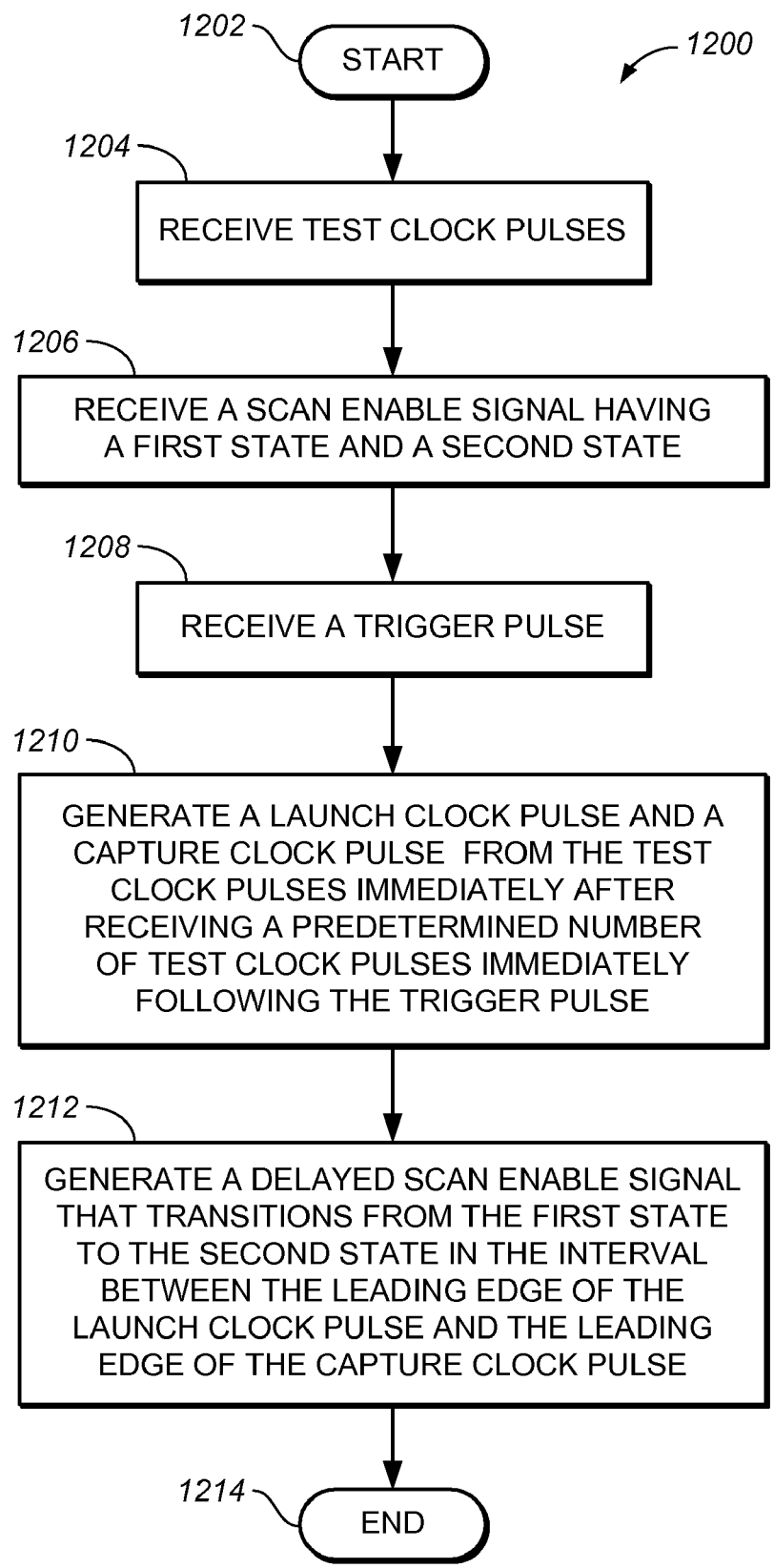
FIG. 12 illustrates a flow chart for a method of controlling clock pulses for launch-off-shift transition delay fault testing.

FIG. 12 illustrates a flow chart 1200 for a method of controlling clock pulses for launch-off-shift transition delay fault testing.

Step 1202 is the entry point of the flow chart 1200.

In step 1204, test clock pulses are received, for example, from a phase locked loop.

In step 1206, a scan enable signal is received having a first state and a second state.

In step 1208, a trigger pulse is received, for example, from a test pattern generated for automated test equipment (ATE).

In step 1210, a launch clock pulse and a capture clock pulse are generated from the test clock pulses immediately after receiving a predetermined number of test clock pulses immediately following the trigger pulse.

In step 1212, a delayed scan enable signal is generated as output that transitions from the first state to the second state in the interval between the leading edge of the launch clock pulse and the leading edge of the capture clock pulse. This feature allows the launch-off-shift test scheme to function properly without having to tune the scan enable signal to accommodate various test configurations.

Step 1214 is the exit point of the flow chart 1200.

Advantages of the clock pulse controller described above include testing integrated circuits at the operating frequency limit, using existing phase locked loop circuits in the integrated circuit design to generate the capture clock pulses, and using clock pulses generated by automated test equipment (ATE) as a backup test and for debugging the integrated circuit design. Also, the clock pulse controller described above may be used with any transition delay fault/inline resistance fault (TDF/IRF) test pattern that uses the launch-off-shift format for at-speed launch and capture using the high speed clock pulses generated by a phase locked loop.

Although the method illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

The specific embodiments and applications thereof described above are for illustrative purposes only and do not preclude modifications and variations that may be made within the scope of the following claims.

What is claimed is:

1. A clock pulse controller comprising:
a test clock pulse input for receiving test clock pulses;
a scan enable input for receiving a scan enable signal having a first state and a second state;
a trigger pulse input for receiving a trigger pulse;
a clock pulse output for generating a launch clock pulse and a capture clock pulse from the test clock pulses immediately after receiving a predetermined number of the test clock pulses immediately following the trigger pulse; and
a delayed scan enable output for generating a delayed scan enable signal that transitions from the first state to the second state between a leading edge of the launch clock pulse and a leading edge of the capture clock pulse.

2. The clock pulse controller of claim 1 further comprising a scan clock pulse input for receiving scan clock pulses, the clock pulse output generating the scan clock pulses when the delayed scan enable signal transitions from the second state to the first state.

3. The clock pulse controller of claim 2 further comprising the delayed scan enable output that transitions from the second state to the first state when the scan enable signal transitions from the second state to the first state.

4. The clock pulse controller of claim 1 further comprising a counter for predetermining the number of the test clock pulses.

5. A clock pulse controller comprising:
means for receiving test clock pulses;
means for receiving a scan enable signal having a first state and a second state;
means for receiving a trigger pulse;
means for generating a launch clock pulse and a capture clock pulse immediately after receiving a predetermined number of the test clock pulses immediately following the trigger pulse; and
means for generating a delayed scan enable signal so that the delayed scan enable signal transitions from the first state to the second state between a leading edge of the launch clock pulse and a leading edge of the capture clock pulse.

6. The clock pulse controller of claim 5 further comprising means for receiving scan clock pulses and means for generating the scan clock pulses in response to a transition of the scan enable signal from the second state to the first state.

7. The clock pulse controller of claim 6 further comprising means for generating the delayed scan enable signal so that the delayed scan enable signal transitions from the second state to the first state when the scan enable signal transitions from the second state to the first state.

8. The clock pulse controller of claim 5 further comprising means for predetermining the number of the consecutive clock pulses.

9. A method of generating clock pulses for an integrated circuit comprising steps of:
receiving test clock pulses;
receiving a scan enable signal having a first state and a second state;
receiving a trigger pulse;
generating a launch clock pulse and a capture clock pulse from the test clock pulses immediately after receiving a predetermined number of test clock pulses immediately following the trigger pulse; and
generating a delayed scan enable signal that transitions from the first state to the second state between a leading edge of the launch clock pulse and a leading edge of the capture clock pulse.

10. The method of claim 9 further comprising steps of receiving scan clock pulses and generating the scan clock pulses after the scan enable signal transitions from the second state to the first state.

11. The method of claim 10 further comprising a step of generating the delayed scan enable signal so that the delayed scan enable signal transitions from the second state to the first state when the scan enable signal transitions from the second state to the first state.

12. The method of claim 11 further comprising a step of predetermining the number of the test clock pulses.

* * * * *